June 7, 1966 C. N. KLAHR 3,255,050

FABRICATION OF SEMICONDUCTOR DEVICES BY TRANSMUTATION DOPING

Filed March 23, 1962

INVENTOR

Carl N. Klahr

BY Clive H. Bramson

ATTORNEY

United States Patent Office 3,255,050

Patented June 7, 1966

3,255,050

FABRICATION OF SEMICONDUCTOR DEVICES BY TRANSMUTATION DOPING

Carl N. Klahr, Brooklyn, N.Y.
(678 Cedar Lawn Ave., Lawrence, N.Y.)

Filed Mar. 23, 1962, Ser. No. 181,892
8 Claims. (Cl. 148—1.5)

This invention relates generally to junction semiconductor devices and more particularly to a method of inserting impurities in a semiconductor crystal in a precise spatial pattern through the utilization of neutron transmutation doping.

As is well known in the art, semiconductors are materials whose electrical resistivity is very high unless they are doped with certain impurities which add conducting electrons or conducting holes to the material. Germanium, e.g., having a valence of 4, obtains electrons from impurities having a valence of 5 to form a semiconductor material containing an excess of electrons, and known as an N-type semiconductor; it obtains holes from impurities having a valence of 3 to form a P-type semiconductor having a deficiency of electrons. Thus, negative or N-type germanium is characterized by a predominance of negative conduction carriers or electrons and is dependent upon the presence of impurities of the donor class. The donor impurities include such materials as phosphorus, arsenic and antimony. A positive or P-type semiconductor is characterized by a predominance of positive conduction carriers or holes and is dependent upon the presence of one or more impurities of the acceptor class. Impurities of this class include such materials as boron, aluminum, gallium and indium. Accordingly, the electrical properties of semiconductors result from the doping thereof with impurities of the aforementioned types.

Semiconductor devices usually comprise at least two zones of opposite-type semiconductor material that are contiguous and form an N-type-P-type junction whereat an electric potential is developed due to the double layer of oppositely charged impurity ions. The spatial pattern of N-type and P-type regions in a semiconductor crystal and the geometric configuration of the P-N junctions therebetween, determine the characteristics of and hence the applicability of a semiconductor device. To that end, e.g., a semiconductor diode being comprised of a single P-N junction, finds application for the purpose of rectification or for providing a unidirectional signal, while a conventional (bipolar) transistor, however, using conductivity by both electrons and holes and consisting of two P-N junctions separated by a third region or base, can be used for power amplification. The field effect (unipolar) transistor using only conductivity by one type of carrier, i.e., either electrons or holes, further exemplifies the state of the art scope of semiconductor devices characterized by various geometric patterns with respect to P-type and N-type regions. Many other useful devices consist of a multiplicity of P-type and N-type regions, each of specified resistivity, having P-N junctions separating them. These regions may have various sizes, shapes, and various degrees of impurity doping. An example of such a complex semiconductor device is a microelectronic circuit, wherein an entire oscillator or amplifier circuit may be incorporated, the various P- and N-type regions acting as the circuit elements.

In general, presently employed methods involving the fabrication of semiconductor devices, e.g., transistors, subsequent to obtaining a suitably purified material, comprise the following steps: (1) single crystals of the semiconductor material are grown from a homogeneous melt either doped or undoped; (2) the impurities are introduced into the crystal in the desired spatial pattern; (3) the single crystal with its impurity structure is cut to the proper size and shape; (4) contact leads are attached; and (5) the device is mounted or encapsulated in an inert protective container. With respect to aforesaid step (2), presently used methods of introducing impurities according to predetermined spatial patterns are both difficult and economically disadvantageous. Included among these contemporary methods are: (a) diffusion of impurities in liquid or gaseous form through the obverse and reverse sides of the crystal; (b) changing the impurity density of the melt during the process of crystal growth; (c) growth of a doped region on the crystal from a vapor phase; and (d) formation of doped regions by an alloying process. Hence, the difficulty, it will be appreciated, lies in introducing the desired spatial pattern of impurities to the crystal being fabricated into a semiconductor device.

Accordingly, it is a principal object of the present invention to provide a method whereby the use of neutron transmutation doping is utilized to obtain strongly non-uniform distributions of impurities in a desired spatial pattern within a semiconductor crystal.

Another object of the instant invention is to provide a method whereby radiation-dies may be used to produce a large variation in the neutron flux within the semiconductor within dimensions of a few mils or less.

A further object of the present invention resides in a method of irradiating a uniformly doped semiconductor crystal whereby the neutron transmutation process produces the opposite type of impurity.

Another object of the instant invention is to provide a method of determining the precise spatial variation of neutron flux level within a semiconductor crystal exposed to neutron radiation in a nuclear reactor.

A further object of the present invention is the provision of a method of controlling the neutron spatial distribution within semiconductor crystals by varying the dimension, configuration and composition of radiation-dies positioned surfacedly of the said crystal being fabricated.

The features of this invention which are believed to be novel are set forth with particularity in the appended claims. The invention itself, however, both as to its organization and method of operation, together with further objects and advantages thereof, may best be understood by reference to the following description when taken in conjunction with the accompanying drawings wherein:

Essentially therefore, and in consonance with the foregoing, the instant invention is directed to methods of inserting precise spatial patterns of impurities into a uniform semiconductor crystal by subjecting the crystal to neutron flux within a nuclear reactor.

Germanium, e.g., the most commonly used semiconductor material, and the isotope GE–70 thereof, in particular, absorbs a neutron and becomes transmuted to gallium–71 when exposed to a neutron flux, GA–71 being a P-type impurity. Two other germanium isotopes undergo neutron transmutation to produce N-type impurities. However, the GE–70 reaction predominates and the net effect of subjecting germanium to bombardment by neutrons of thermal energy is to produce approximately 30 P-type impurities and 12 N-type impurities for each hundred neutrons absorbed, thus leaving a net of 18 P-type impurities.

It will be understood that the terms "neutrons of thermal energy" and "thermal neutrons" as used herein are identical in meaning to the commonly accepted definition thereof, such definition being given, e.g., in the Van Nostrand International Dictionary of Physics and Electronics, July 1959 Edition, and defined therein as "neutrons in thermal equilibrium with the substance in which they exist; commonly, neutrons of kinetic energy about 0.025 e.v., which is about ⅔ of the mean kinetic energy of a moluecule at 15° C.

It has been further established that silicon isotope Si–30, e.g., becomes transmuted to phosphorus, an N-ype impurity, by neutron transmutation in a nuclear reactor, this reaction being less rapid than the germanium reaction, thus requiring longer periods of radiation time and hence being comparatively more costly.

Many other semiconductor materials of present or potential commercial importance participate in neutron transmutation reactions and accordingly may be doped thereby. Examples of such semiconductor compounds include indium antimonide, lead telluride and gallium arsenide.

It being understood that exposure of a semiconductor crystal to the neutron flux and other radiation within a reactor may produce damage to the crystalline material in the form of a disorder of the crystalline regularity on an atomic scale, it will, however, be appreciated that such radiation-produced defects can be cured through annealing by appropriate heating for specified time lengths at temperatures within the range of 400° C. and 700° C.; the annealing having no effect with respect to neutron transmutation-produced nuclides, but resulting only in the removal of radiation damage defects through restoration of crystal symmetry and order.

Figure 1:
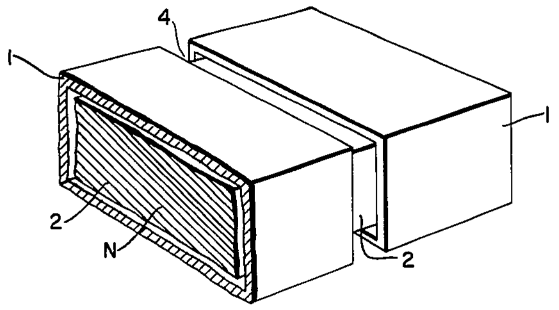
FIGURE 1 is a partially sectioned perspective view of an absorber radiation-die with a peripheral slit to admit neutrons into the semiconductor.
Figure 2:
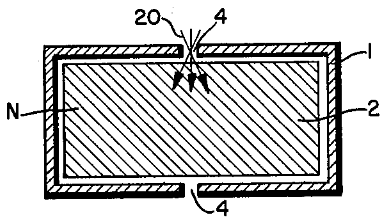
FIGURE 2 is a side elevation view in section of the entire absorber radiation-die and semiconductor shown in FIGURE 1.

Referring now to FIGURES 1 and 2 of the drawings, a radiation-die, designated by numeral 1 is shown surrounding semiconductor crystal 2, gap or slit 4 being provided peripherally of said radiation-die to thus expose parts of the semiconductor crystal 2 to neutron radiation according to the circumferential pattern of the slit.

Figure 3:
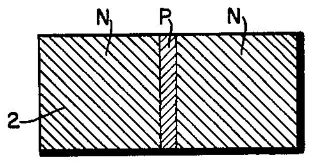
FIGURE 3 is a side elevation view in section of the resulting pattern of doping according to the absorber radiation-die geometry as shown in FIGURES 1 and 2.

The radiation-die contemplated within the purview of this invention may consist either of a single thermal neutron absorber material or of a combination of a plurality of thermal neutron absorber materials. The radiation-die controls the detailed spatial distribution of neutrons within the semiconductor, and therefore the density of impurity atoms produced in spatial detail, the density being in direct proportion to the local flux. Hence, the radiation-die employed in FIGURES 1 and 2 produce the N-P-N pattern illustrated in FIGURE 3 of the drawings. Accordingly, it will be understood, the term radiation-die as used herein, is a neutron shield which completely envelopes the semiconductor material except for those regions provided with gaps or slits as herein disclosed. Hence, the purpose of the radiation-die is to shield the material against neutrons that would otherwise cause the doping reaction.

It will be understood that the radiation-die may vary with respect to thickness, gap arrangement and dimensioning thereof, or be composed of sections of various materials, e.g., neutron absorbing material and neutron intensifying material, the local variations being determinitive of the variation of neutron flux within the semiconductor.

As aforedescribed, exposure of germanium to a thermal neutron flux causes transmutations therein producing P-type impurities on a net basis. Hence, a uniform specimen of N-type germanium 2 surrounded by neutron absorbing material 1, e.g., boron or cadmium, will not substantially be transmuted except at the uncovered regions 4, whereat the P-type impurity will dominate the uniform N-type impurity to produce P-type regions under the said gaps 4 provided through the neutron absorber, this effect being realised upon subjecting the crystal-radiation die-absorber combination to sufficient neutron radiation.

Figure 4:
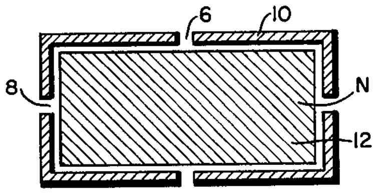
FIGURE 4 is a side elevation view in section of a modified form of the invention.
Figure 5:
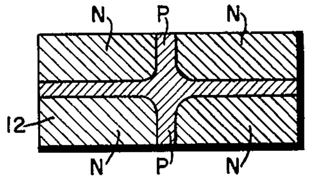
FIGURE 5 is a side elevation view in section of the resulting pattern of doping according to the absorber radiation-die geometry as shown in FIGURE 4.

As will be observed by reference to FIGURES 4 and 5 of the drawings, two peripherally intersecting gaps 6 and 8, provided through the surface of radiation-die 10 and disposed therein in mutually perpendicular relation, produce intersecting P-type regions within semiconductor material 12, this geometrical pattern being otherwise very difficult of achievement. A further example of a type of doping configuration which can be produced consists of a series of parallel spaced line slits within the radiation die, the resulting transmutation doping pattern being one of a large surface area P-region and of shallow depth with respect to the surface of the semiconductor crystal. As demonstrated by the latter described spatial pattern, it will be well to state that a myriad of formidable doping geometries, too numerous to mention or illustrate, and falling within the scope of this disclosure, can be produced by appropriate apertureslit and gap configurations arranged within a suitable radiation-die.

Figure 6:
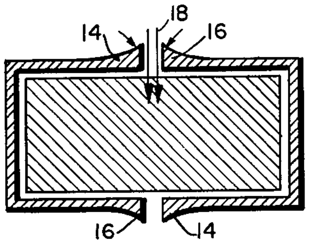
FIGURE 6 is a side elevation view in section of an absorber radiation-die, the configuration thereof being to shape neutron angular distribution.

It is also easy to collimate the neutron distribution, i.e., to shape the neutron angular distribution entering through gaps in the radiation-die toward perpendicularity with respect to the surface of the semi-conductor material, this feature being illustrated in FIGURE 6 of the drawings. Thus, it is seen that the thickness and shape of the neutron absorber 14 in the surrounding portion of gap 16, modifies the neutron angular distribution to collimate the neutron flux 18. That is, only neutrons moving approximately perpendicular to the semiconductor surface will enter the semiconductor through said gap, only the volume directly beneath the gap receiving a substantial neutron flux. Minimal clearance 19 between the radiation-die and semiconductor surfaces further enhances collimation of the neutron beam. The effect of this collimation method may be contrasted with angular distribution of neutrons 20 shown in FIGURE 2, the modification disclosed in FIGURE 6 being absent therefrom.

Figure 7:
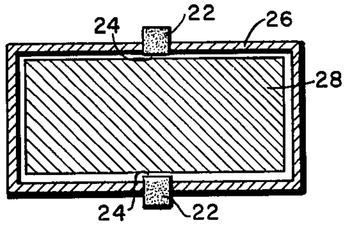
FIGURE 7 is a side elevation view in section of an absorber radiation-die used in conjunction with moderator material for neutral intensification at the slit regions.

In FIGURE 7 is shown a further modification of the invention wherein a neutron intensifier material 22 is positioned within gap 24 provided in the neutron absorber material 26 surrounding the semiconductor material 28. Neutron intensifiers or neutron moderating coupons, i.e., layers, and hydrogen coupons in particular, act as thermal neutron producing sources by reducing the speed of high energy neutrons. Consequently these produced thermal neutrons augmenting the quantity of thermal neutrons initially available without the radiation-die, collectively enter the semiconductor material through gap 24 therefor provided.

The quantitative possibility of close spatial control of the neutron flux may be illustrated by the neutron distribution within the semiconductor for a small aperture within the absorber radiation die, this distribution corresponding to a point source. The neutron flux $\phi(r)$ at a distance $r$ from the source hole is given (not normalized) by the expression $$\phi(r)=\frac{e^{-r}}{4\pi r^2}$$

in units of the neutron mean free path (about 3 cm. in germanium at thermal energies). For $r$=one-tenth of a mil $$\phi(r)=\frac{1}{4\pi r^2}=\frac{1}{4\pi(10^{-4})^2}=\frac{10^8}{4\pi}$$

For $r$=two-tenths of a mil, $\phi(r)$=one-fourth this value, thus indicating the neutron flux decreases by 400% over a distance of one-tenth of a mil.

Accordingly, the foregoing detailed description has been concerned with fabrication of semiconductor crystals by insertion of the crystal within a radiation-die and exposure of said crystal and radiation-die to neutron radiation in a nuclear reactor. It will be appreciated that the time of exposure within the reactor and the neutron flux level at the exposure location both determine the concentration of transmutation produced impurities in the absence of the radiation die. The radiation die, however, alters the general flux level in the semiconducting crystal and determines the precise spatial variation of the flux, large flux variations within dimensions of a few mils or less being achieved. The precise flux level and the spatial variation thereof within the crystal is calculatable by usual methods of analysis of neutron distributions. It is of course necessary and feasible to choose the reactor irradiation time to permit both N- and P-type regions to exist within the crystal in accordance with the required pattern of impurities for the specific semiconductor device that is desired, the irradiation time as well as the neutron flux level and spatial pattern of impurities being determinable by known methods.

Following the irradiation procedure as previously described herein, the germanium or other suitable semiconductor crystal is removed from the reactor and taken out of the surrounding radiation-die. The said crystal is permitted to "cool off" for an appropriate period, safe handling thereof being possible only after radioactivity has sufficiently diminished. The crystal is next annealed in an inert-atmosphere-furnace to remove the radiation-induced imperfections in the crystalline structure which do not result from nuclear transmutation. The crystal is then cut, lapped and etched whereafter contact leads are suitably attached, the device being finally mounted in an appropriate manner.

While the present invention has been described by reference to particular embodiments thereof, it will be understood that numerous modifications may be made by those skilled in the art without actually departing from the invention. The appended claims, therefore, are intended to cover all such equivalent variations as come within the true spirit and scope of the foregoing disclosure.

What is claimed is:

1. A method of impurity doping a semiconductor crystal to produce a spatial pattern of doped regions therewithin comprising the steps of selecting a crystal of semiconductor material of a prescribed conductivity type, enveloping said semiconductor crystal with a thermal neutron absorbing material having a slit therethrough, said material being selected from the group consisting of cadmium and boron, exposing the enveloped crystal to thermal neutron radiation which is capable of transforming the region of said crystal adjacent said slit to a conductivity type of opposite nature to said prescribed conductivity type for a time sufficient to accomplish same, removing said crystal from the radiation, and annealing said crystal to remove radiation produced defects.

2. A method of preparing a semiconductor device comprising the steps of selecting a crystal of semiconductor material of a prescribed conductivity type, enveloping said crystal with a thermal neutron absorbing material having a peripheral slit thereabout, said material being of sufficient thickness to exclude a substantial fraction of incident thermal neutrons except at regions of said crystal exposed through said peripheral slit, exposing the enveloped crystal to thermal neutron radiation which is capable of transforming the regions of said crystal adjacent said slit to a conductivity type of opposite nature to said prescribed conductivity type for a length of time sufficient to create P-N junctions therein, removing said crystal from the radiation, and annealing said crystal to remove radiation produced defects.

3. A method of preparing a semiconductor device comprising the steps of selecting a crystal of semiconductor material of a prescribed conductivity type, enveloping said crystal with a thermal neutron absorbing material having intersecting slits therethrough, said material being of sufficient thickness to exclude a substantial fraction of incident thermal neutrons except at regions of said crystal exposed through said intersecting slits, exposing the enveloped crystal to thermal radiation which is capable of transforming the regions of said crystal exposed through said slits to a conductivity type of opposite nature to said prescribed conductivity type for a time sufficient to accomplish same, removing said crystal from the radiation, and annealing said crystal to remove radiation produced defects.

4. The method of preparing a semiconductor device set forth in claim 3 wherein said slits are provided peripherally of the crystal and intersect with each other at right angles.

5. A method of preparing a semiconductor device comprising the steps of selecting a crystal of semiconductor material of a prescribed conductivity type, enveloping said semiconductor crystal with a thermal neutron absorbing material having an opening therethrough, said material being of sufficient thickness to exclude a substantial fraction of incident thermal neutrons except at regions of said crystal exposed through said opening, said material being selected from the group consisting of cadmium and boron, exposing the enveloped crystal to thermal neutron radiation which is capable of transforming the region of said crystal adjacent said opening to a conductivity type of opposite nature to said prescribed conductivity type for a time sufficient to accomplish same, and removing said crystal from the radiation, and annealing said crystal to remove radiation produced defects.

6. A method of impurity doping a semiconductor crystal to produce a spatial pattern of doped regions therewithin comprising the steps of selecting a crystal of semiconductor material of a prescribed conductivity type, enveloping said crystal with a thermal neutron absorbing material of sufficient thickness to exclude a substantial fraction of the incident thermal neutrons except at regions of said crystal exposed through a slit provided through said neutron absorbing material, the thickness of said material forming the walls of the slit being greater than the thickness of the remaining portions of said material to thereby collimate the neutron distribution entering the slit, exposing the enveloped crystal to thermal neutron radiation which is capable of transforming the regions of said crystal adjacent said slit to a conductivity type of opposite nature to said prescribed conductivity type for a length of time sufficient to accomplish same, and removing said crystal from the radiation.

7. A method of preparing a semiconductor device comprising the steps of selecting a crystal of semiconductor material of a prescribed conductivity type, enveloping said semiconductor crystal with a thermal neutron absorbing material having an opening therethrough, neutron intensifier material being positioned within the opening, exposing the enveloped crystal to thermal neutron radiation which is capable of transforming the region of said crystal adjacent said opening to a conductivity type of opposite nature to said prescribed conductivity type for a time sufficient to accomplish same, removing said crystal from the radiation, and annealing said crystal to remove radiation produced defects.

8. A method of impurity doping a semiconductor crystal to produce a spatial pattern of doped regions therewithin comprising the steps of selecting a crystal of semiconductor material of a prescribed conductivity type, enveloping said semiconductor crystal with a thermal neutron absorbing material having a slit therethrough, the thickness of said absorbing material being in the range of 1 to 10 mean free paths of absorbing material, said material being selected from the group consisting of cadmium and boron, exposing the enveloped crystal to thermal neutron radiation which is capable of transforming the region of said crystal adjacent said slit to a conductivity type of opposite nature to said prescribed conductivity type for a time sufficient to accomplish same, removing said crystal from the radiation, and annealing said crystal to remove radiation produced defects.

References Cited by the Examiner

UNITED STATES PATENTS

| | | | |
|---|---|---|---|
| 2,994,628 | 8/1961 | Paskell | 148—1.5 |
| 2,995,473 | 8/1961 | Levi | 148—1.5 |
| 3,076,732 | 2/1963 | Tanenbaum | 148—1.5 |

OTHER REFERENCES

"Disordered Regions in Semiconductors Bombarded by Fast Neutrons," by B. R. Gossick, Journal of Applied Physics, volume 30, pages 1214–1218, August 1959.

Glasstone: "Principles of Nuclear Reactor Engineering," D. Van Nostrand Company, Inc., Princeton, New Jersey, 1955, pages 486 and 582–583.

Schweinler: "Some Consequences of Thermal Neutron Capture in Silicon and Germanium," Journal of Applied Physics, volume 30, No. 8, pages 1125 and 1126, August 1959.

"Some Effects of Fast Neutron Irradiation on Carrier Lifetimes in Silicone," by R. W. Beck and E. Paskell, Journal of Applied Physics, volume 30, pages 1437–1439 September 1959.

Tanenbaum et al.: "Preparation of Uniform Resistivity N-Type Silicon by Nuclear Transmutation," Journal of the Electrochemical Society, volume 108, No. 2, pages 171–176, February 1961.

HYLAND BIZOT, *Primary Examiner.*

MARCUS U. LYONS, DAVID. L. RECK, *Examiners.*